United States Patent
Artman et al.

(10) Patent No.: US 7,343,227 B1
(45) Date of Patent: Mar. 11, 2008

(54) CURRENT SENSING TEMPERATURE CONTROL CIRCUIT AND METHODS FOR MAINTAINING OPERATING TEMPERATURES WITHIN INFORMATION HANDLING SYSTEMS

(75) Inventors: Paul T. Artman, Austin, TX (US); Sandor T. Farkas, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 11/514,009

(22) Filed: Aug. 31, 2006

(51) Int. Cl.
*G06F 19/00* (2006.01)
*G05D 23/00* (2006.01)

(52) U.S. Cl. .................................................. 700/299

(58) Field of Classification Search ................ 700/299, 700/300; 323/907; 324/670, 685, 721; 257/706, 257/707, 712–722; 361/688–723
See application file for complete search history.

(56) References Cited

U.S. PATENT DOCUMENTS

| | | | | |
|---|---|---|---|---|
| 6,301,105 B2 * | 10/2001 | Glorioso et al. | ............. | 361/685 |
| 6,714,026 B2 * | 3/2004 | Kronrod | ................. | 324/699 |
| 6,781,056 B1 * | 8/2004 | O'Rourke et al. | .......... | 174/535 |
| 6,880,970 B2 | 4/2005 | Mirov | | |
| 7,002,360 B2 * | 2/2006 | Kronrod | ................. | 324/699 |
| 7,036,027 B2 * | 4/2006 | Kim et al. | ................ | 713/300 |
| 2001/0006453 A1 * | 7/2001 | Glorioso et al. | ............. | 361/685 |
| 2002/0080852 A1 * | 6/2002 | Mirov | ........................ | 374/208 |
| 2006/0285575 A1 * | 12/2006 | Park | .......................... | 374/141 |

OTHER PUBLICATIONS

U.S. Appl. No. 11/406,487, filed Apr. 18, 2006.

* cited by examiner

*Primary Examiner*—M. N. Von Buhr

(57) ABSTRACT

An information handling system including a system fan control for maintaining operating temperatures of electronics within the information handling system is disclosed. The information handling system can include a power trace provided in association with a power circuit that can power electronics within the information handling system. The power trace can include a reduced trace width region that may be operable to provide a temperature differential in response to a current change within the reduced trace width region. A thermistor may be provided in close proximity to the reduced trace width region and can be operable to detect the temperature differential provided in response to the current change. The thermistor may provide an input to a fan controller that may be operable to alter a fan speed to maintain an operating temperature of the electronics that may be coupled to the power trace.

20 Claims, 2 Drawing Sheets

CURRENT SENSING TEMPERATURE CONTROL CIRCUIT AND METHODS FOR MAINTAINING OPERATING TEMPERATURES WITHIN INFORMATION HANDLING SYSTEMS

FIELD OF THE DISCLOSURE

The present disclosure relates generally to information handling systems. More specifically, the present disclosure relates to current sensing temperature control circuits and methods for maintaining operating temperatures within information handling systems.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the speed and processing power of information handling systems increases, component power consumption and corresponding operating temperatures have increased. For example, components such as fully buffered DIMMS (FBD) memory, chipsets, PCI buses, and control logic have seen large increases in power consumption as operating speeds and performance demands continue to rise. However, accurate temperature reporting mechanisms have not kept pace with temperature control demands within information handling systems. For example, power consumption and temperature management primarily depend on using system level fans controls to maintain temperatures. Such controls are challenged due to inaccurate temperature value detection, cumbersome reporting paths, and the number of component temperatures being reported.

Some conventional temperature control systems use temperature monitors, or thermistors, to report temperatures within housings to control fan speeds and maintain component temperatures. For example, as internal ambient temperatures increase, fan speeds are increased to reduce heating within the system housing and lower internal ambient temperatures. This leads to an overall decrease in fan operating speeds, which may not be required as in most instances; ambient temperatures are representative of actual component temperatures. As a result, very little internal ambient temperature resolution is achieved and poor mapping of thermistor temperatures to component cooling requirements is compromised.

Another conventional solution for controlling operating temperatures includes providing current sense resistors as inputs to system fan controls for controlling fan speeds. For example, current sense resistors have been used to sense voltage regulation down (VRD) power delivery and provide an indication of component power dissipation and component temperatures. However, bill of materials (BOM) costs associated with using current sense resistors is fairly high and the level of accuracy is lower then required for some applications. Additionally, the output signal of current sense resistors is fairly dynamic which can lead to quick changes in inputs to system fan controls causing fans to speeds to prematurely change increase and/or decrease in response to changes in current. For example, as compared to current sense resistors, component temperatures have large relative thermal mass and are somewhat slow reacting (seconds vs. milliseconds). Moreover, use of current sense resistors requires an application specific coding to achieve a mapping of power consumption to temperature variations while conditioning fan speed output signals. The increased software and processing overhead to achieve desirable operating temperatures complicates controlling temperatures through varying fan speed outputs. As such, what is needed is a simplified temperature control mechanism that allows for component specific detection of temperature variants and utilizes conventional system fan controls for cooling specific electronic components within information handling systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
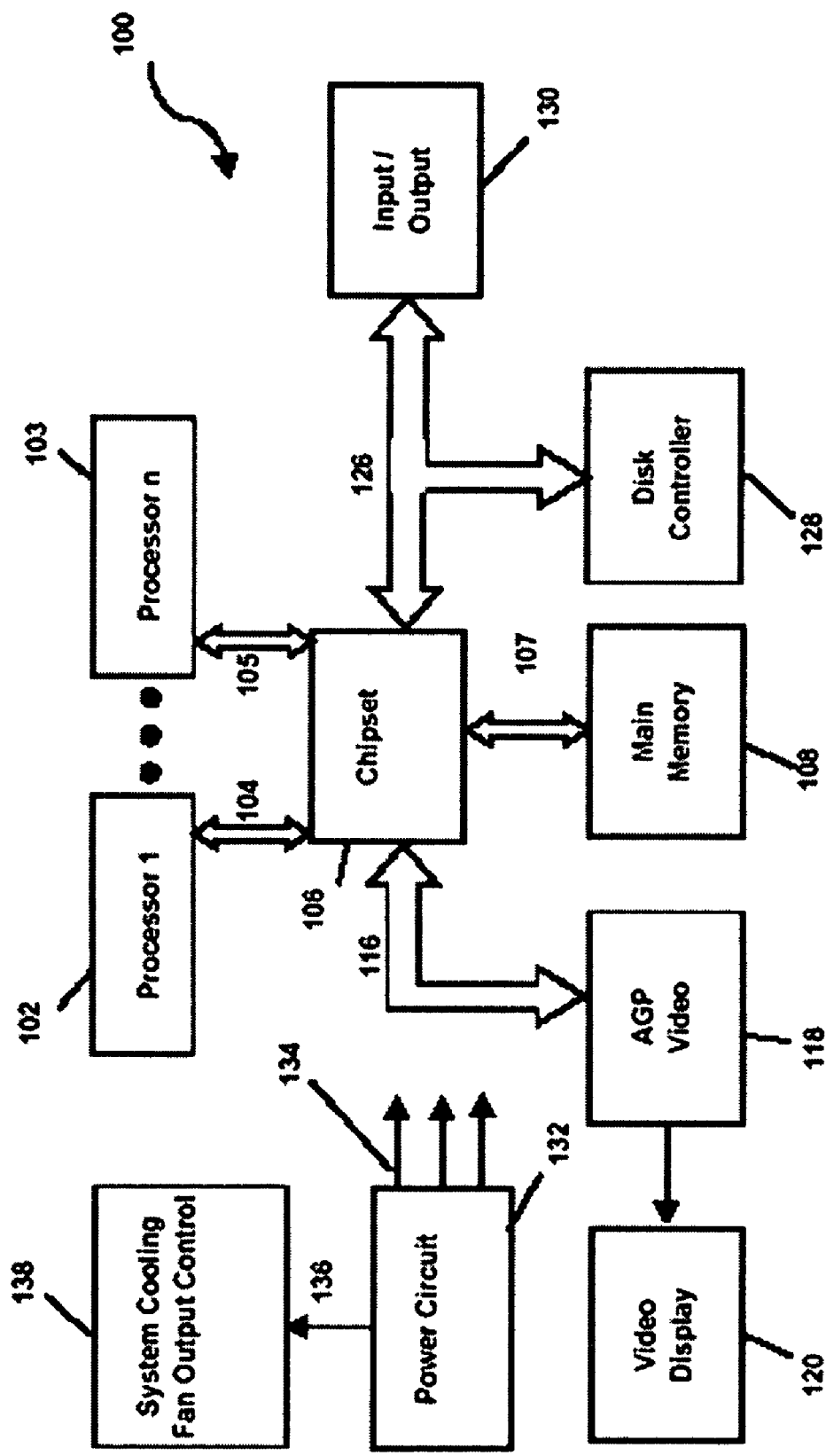
FIG. 1 illustrates a block diagram of an information handling system according to one aspect of the disclosure.

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As indicated above, the following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. For example, much of the following focuses on information handling systems having printed circuit boards (PCBs) with quality verification test structures and methods for testing test structures. However, other teachings may certainly be utilized in this application. The teachings may also be utilized in other applications and with several different types of architectures such as distributed computing architectures, client/server architectures, or middleware server architectures, and associated components.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

According to one aspect, an information handling system that can include a system fan control for maintaining operating temperatures of electronics within the information handling system is provided. The information handling system can include a power trace provided in association with a power circuit for powering electronics within the information handling system. The power trace can include a first reduced trace width region along the power trace and can provide a temperature differential in response to a current change within the reduced trace width region. The information handling system may further include a thermistor provided in close proximity to the reduced trace width region and the thermistor can detect the temperature differential provided in response to the current change. A fan controller may be coupled to an output of the thermistor and responsive to the temperature differential detected by the thermistor. The fan controller may be further operable to alter a fan speed of a fan based on the output of the thermistor and can maintain an operating temperature of the electronics coupled to the power trace.

According to another aspect, a method of maintaining operating temperatures of electronics stored within an information handling system is disclosed. The method can include detecting a temperature differential using a thermistor provided in close proximity to a power trace operably associated with a power circuit for powering electronics within the information handling system. The power trace can include a reduced trace width region along the power trace and may be operable to provide a temperature differential in response to a current change within the reduced trace width region. The method may further include receiving an input from the thermistor and altering a fan speed of a fan to maintain an operating temperature of the electronics in response to the input.

According to a further aspect, a printed circuit board (PCB) for use within an information handling system that can include a system fan control for maintaining operating temperatures of electronics stored within the information handling system is provided. The PCB may include a power trace provided in association with a power circuit for powering electronics within the information handling system. The power trace can also include a reduced trace width region along the power trace and operable to provide a temperature differential in response to a current change within the reduced trace width region. The PCB may further include a thermistor-coupling region that can mount a thermistor in close proximity to the reduced trace width region. The thermistor can be operable to detect the temperature differential provided in response to the current change. The PCB may also include a thermistor output connection provided in association with the thermistor-coupling region. The thermistor output region may be coupled to a fan controller of the information handling system and may provide an input to alter a fan speed to maintain an operating temperature of the electronics coupled to the power trace.

FIG. 1 illustrates a block diagram of an exemplary embodiment of an information handling system employing PCBs. The information handling system, generally designated at 100, can include one or more electronic components mounted on a least one PCB (not expressly shown) and can communicate data and control signals there between over signal buses which may include constant impedance electrical conductors.

As shown in FIG. 1, the information handling system 100 can include a first physical processor 102 and an $n^{th}$ physical processor 103 coupled to a first host bus 104. The first physical processor 102 can be coupled to a chipset 106 via the first host bus 104. Further, the $n^{th}$ physical processor 103 can be coupled to the chipset 106 via a second host bus 105. The chipset 106 may also be referred to as a memory controller hub or a memory controller, and the chipset 106 can be coupled to a main memory 108 via a third host bus 107. In a particular embodiment, the host buses 104, 105, and 107 can be individual buses or part of the same bus.

The chipset 106 can provide bus control to handle transfers between the host buses 104, 105, 107, and one or more of other buses, e.g. a PCI bus 114, and an video bus 116, coupled to a video graphics interface 118, which drives a video display 120. A third bus 126 may also be coupled to PCI bus coupled to the chipset 106. The third bus 126 may also include other industry standard buses or proprietary buses, e.g., ISA, SCSI, I2C, SPI, or USB buses. A disk controller 128 and input/output interfaces 130 may be connected to the third bus 126 using industry standard buses or proprietary buses or their own respective interfaces and/or controllers.

In a particular embodiment, the chipset 106 can be generally considered an application specific chip set that provides connectivity to various buses, and integrates other system functions such as a memory interface. For example, an Intel® 820E and/or 815E chip set, available from Intel Corporation of Santa Clara, Calif., provides at least a portion of the north bridge 106. The chip set may also be packaged as an application specific integrated circuit (ASIC). The chipset 106 can generally include functionality to couple the main system memory 108 to other devices within the information handling system 100. Thus, memory controller functions, such as main memory control functions can reside in the chipset 106.

The information handling system 100 may further include a power supply/circuitry 132 that may provide input power 134 to the one or more components within the information handling system 100. The power supply/circuitry 132 may further provide input power 134 to the various components within the information handling system 100, and can further provide an input 136 to a system cooling fan output control 138 for maintaining an operating temperature of the information handling system 100. The system cooling fan output control 138 may include logic for controlling one or more electric cooling fans for cooling various components, circuit boards, electronic devices, etc. of the information handling system 100. For example, one or more PCB(s) (not expressly shown) may be used to mount and electrically interconnect the aforementioned electronic components. Component temperatures may be maintained through monitoring temperature differentials at reduced trace width regions of power traces within the power supply/circuitry 132. Temperature differentials can be provided at the input 136 which may include one or more inputs and can provide control inputs for system cooling fan output control 138. In this manner, system cooling fan output control 138 can alter fan speeds to maintain an operating temperature without overcooling information handling system 100 or increasing acoustic levels that result from operating fans unnecessarily.

Figure 2:
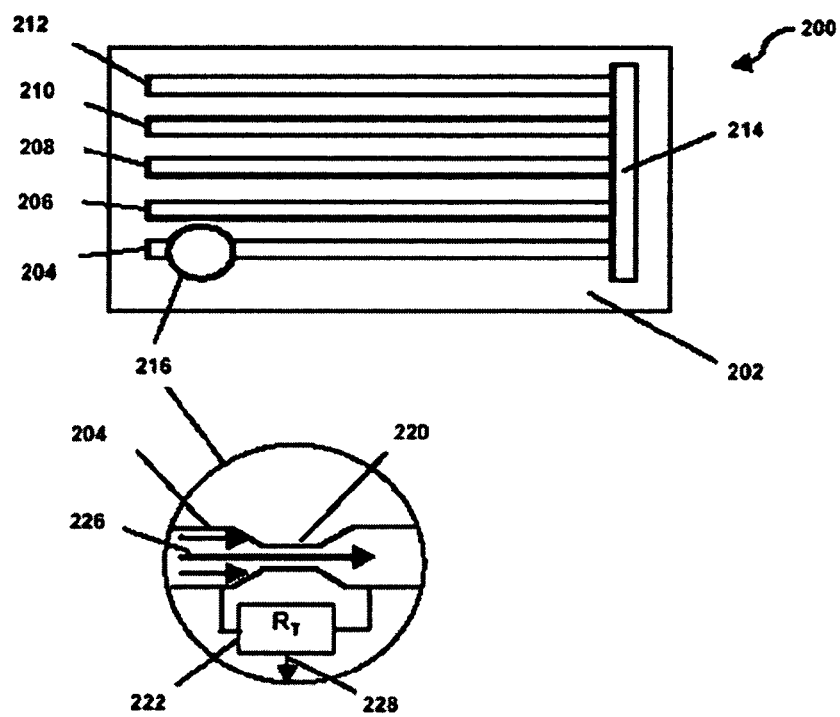
FIG. 2 illustrates a functional block diagram of a circuit board having a reduced power trace width for detecting changes in operating temperatures of associated electronics within an information handling system according to another aspect of the disclosure.

FIG. 2 illustrates a functional block diagram of a printed circuit board (PCB), generally designated at 200, incorporating a reduced power trace width for detecting changes in operating temperatures of associated electronics within an information handling system. The PCB 200 can include a substrate 202 that may be formed from a flame retardant four (FR4) material or other types of PCB material. The PCB 200 may further include a first power trace 204, a second power trace 206, a third power trace 208, a fourth power trace 210, and an $n^{th}$ power trace 212 for routing power to various electronic components (not expressly shown). The power traces 204, 206, 208, 210, and 212 may be formed from various types of conductive materials including copper, alloys, or other types or combinations of electrically conductive materials that may be used to form a trace.

In a particular embodiment, the PCB 200 can distribute power to various electronic components within an information handling system such as information handling system 100 of FIG. 1. The PCB 200 may further include a power/ground plane, collectively illustrated at 214. Power and ground planes can typically provide one or more power levels that may be accessed by a power trace and may be provided within one or more layers of the PCB 200. Power traces 204, 206, 208, 210, and 212 can route power to various electronic components (not expressly shown) on the PCB 200. One skilled in the art can appreciate that power traces 204, 206, 208, 210, and 212 may be provided in a variety of topologies and may be routed to various electronic components or devices (not expressly shown). Additionally, although not illustrated, various conductors or traces may be provided at one or more layer or level of the PCB 200, including signal buses, control buses, data buses, power buses, etc. as needed.

In a particular embodiment, the first power trace 204 can be further shown by an expanded view 216 and may include a reduced trace width region 220. The reduced trace width region 220 may be created during a PCB board fabrication process when routing power traces for VRDs or other electronic components. The reduced trace width region 220 can be provided along the first power trace 204. The reduced trace width region 220 can create a temperature differential provided by resistive heating that may be generated as a current 226 flows though the reduced trace width region 220. Temperature differentials, such as increases and decreases in temperature at the reduced trace width region 220, may be caused by changes in flow of the current 226, can which can be detected by a thermistor $R_T$ 222 that may be provided in close proximity to the reduced trace width region 210 of the first power trace 204. Thermistors are electronic devices that can provide accurate temperature measurements and typically include a resistance of a few thousand ohms at room temperature and may include excellent conformity and accuracy (e.g. 0.1-0.2° C.). The size and type of thermistor $R_T$ 222 provided may be based on the expected temperature differential induced at the reduced trace width region 220 and the expected performance or energy output of the first power trace 204.

In one embodiment, thermistor $R_T$ 222 may detect changes in local board temperatures at the reduced trace width region 220, may provide an output 228 to a system fan controller (not expressly shown), and can alter an operating speed of a fan to maintain an operating temperature of electronic components or devices that may be coupled to the first power trace 204. As such, the thermistor $R_T$ 222 may be operable to provide a sufficient output to initiate a change in a fan operating speed. In other embodiments, the output 228 may also be amplified as needed prior to communicating to a system fan control.

In one embodiment, the thermistor $R_T$ 222 may be provided as a surface mount thermistors that may use as five (5) sided wrap-around terminations (not expressly shown) to allow reliable mounting using conventional conductive epoxy onto various substrates. For example, substrates such as aluminum as well as standard PC Board material work well for mounting the thermistor $R_T$ 222. In one form, a National Semiconductor Thermistor, Part No. LM82 may be used. Other thermistor manufacturers by Maxim may also be used. Sizing of the thermistor $R_T$ 222 may be provided to sufficiently cover the reduced trace width region 220.

In one embodiment, the thermistor $R_T$ 222 may be coupled to the reduced trace width region 220 using a thermal via. Thermal vias can enable efficient coupling of thermal energies or temperature differentials to remote locations and may be provided to couple the thermistor $R_T$ 222 to the reduced trace width region 220 without coupling the thermistor $R_T$ 222 directly to the reduced trace width region 220. In another embodiment, the thermistor $R_T$ 222 may be placed along a back side or rear portion of the PCB 200 to limit reactions of the thermistor $R_T$ 222 to power changes or energy dissipation of other devices or components coupled to the PCB 200. In this manner, the output 228 of the thermistor $R_T$ 222 may be dampened by the PCB's 200 thermal mass thereby providing a good linear mapping to component cooling requirements without requiring firmware or basic input/output system (BIOS) conditioning for controlling fan speeds based on the output 228.

In one embodiment, the reduced trace width region 220 and the thermistor $R_T$ 222 may be thermally isolated from the power planes or ground planes 214 through providing the reduced trace width region 220 and the thermistor $R_T$ 222 at a sufficient distance from power planes or ground planes 214. In this manner, increases in resistive heating of the reduced trace width region 220 may be realized without increasing power loss in the power planes or ground planes 214. Additionally, the bulk board conductivity of the PCB 200 may be reduced and can cause an increase in the localized temperatures in response to power consumption at the reduced trace width region 220 of the PCB 200.

During operation, the thermistor's $R_T$ 222 can react to power changes and can detect increases and decreases in temperature that may be caused by flow of the current 226 at the reduced trace width region 220. The output 218 can be provided based on temperature differentials in resistive heating or cooling at the reduced trace width region 220, and can be coupled to a system fan control to control the speed of one or more fans (not expressly shown) for cooling electronics associated with the detected flow of the current 226. For example, a desired operating temperature range of the electronics may be between twenty-five (25) and forty-five (45) degrees C. The thermistor $R_T$ 222 can detect the changes in temperature or temperature differentials and can provide the output 228 to a system fan control as a function of power consumption of associated electronics coupled to the first power trace 204. As such, a fan speed may be altered to ensure the operating temperature range can be maintained in response to the flow in the current 216, that can be detected at the reduced trace width region 220. In other embodiments, the thermistor $R_T$ 222 may also output a resistance range, or a voltage/current range, or a numeric value using a bus such as an I2C enabled bus such that changes in temperature or temperature differentials may be provided in association with altering a fan speed to ensure the operating temperature range may be provided.

In a particular embodiment, the first power trace 204 may include a twenty (20) ampere trace having a general trace width of one inch (1") and a reduced trace width region 220 having a dimension of two-tenths of an inch (0.200"). During operation, a twenty (20) amp value for the flow of current 226 may be felt at the reduced trace width region 220, and may cause a power dissipation of 0.4 Watts and a temperature rise of about 6.4° C. that may be detected by the thermistor $R_T$ 222. As a result, the thermistor $R_T$ 222 can output a signal at the output 228, indicating a 6.4° C. temperature increase has been detected.

In one form, a system fan control may be altered to increase or decrease a fan speed for one or more fans associated with cooling specific electronics and provided in association with the first power trace 204. For example, a fan speed for a fan may be increased to cool the electronics based on the temperature of about 6.4° C. expected increase in power dissipation of the associated electronics. For example, associated electronics may realize a greater temperature increase than detected by $R_T$ 222. As such, an actual power consumption associated with current flow 226 at the reduced trace width region 220 and consumed and/or dissipated by specific electronics coupled to the first power trace 204 may be determined. Localized ambient temperatures of the PCB 200 for the specific electronics coupled to the first power trace 204. For example, a change in temperature of the first power trace 204 may be correlated to the associated electronics which may realize a greater increase in temperature. As such, a fan speed of the associated electronics may be altered to maintain a temperature. For example, for an increase in 6.4° C., an associated electronic device may realize an overall increase of five (5) times the amount of 6.4° C. or approximately 32° C. As such, a fan speed may be altered to ensure that electronics may be cooled to reduce the temperature by approximately thirty-two 32° C.

In a similar manner, as a decrease in the current flow 226 can be incident to the reduced trace width region 220, a decrease in relative temperature output by the reduced trace width region 220 can be detected by the thermistor $R_T$ 222. As such, the output 228 can provide a signal to the system fan control to decrease a fan speed of a fan. In this manner, as the current flow 216 increases and decreases, the output 218 of thermistor $R_T$ 222 can provide an actual power consumption of electronic components coupled to the first power trace 204 and a desired operating temperature may be maintained for the specific electronic devices.

Figure 3:
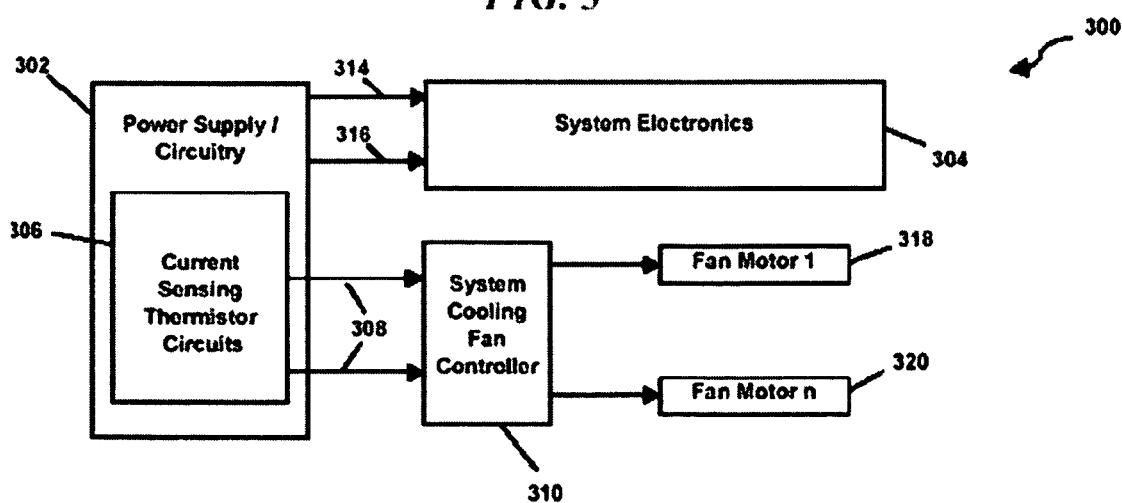
FIG. 3 illustrates a functional block diagram of an information handling system employing current sensing thermistor circuits for detecting power dissipation of electronics within the information handling system according to one aspect of the disclosure.

FIG. 3 illustrates a functional block diagram of an information handling system, generally designated 300, and employing current sensing thermistor circuits for detecting power dissipation of electronics within the information handling system according to one aspect of the disclosure. The information handling system 300 can include a power supply and a power/supply circuitry 302 for powering system electronics 304 of the information handling system 300. The power supply/circuitry 302 can further include one or more of the current sensing thermistor circuits 306, similar to the first power trace 204, as described in FIG. 2 above. One or more thermistor outputs 308 can be coupled to a system cooling fan controller 310. The thermistor outputs 308 in combination with the system cooling fan controller 310 may be used in association with operating fan speeds of a first fan 318 or an $n^{th}$ fan 320. The first fan 318 and $n^{th}$ fan 320 may be used to maintain operating temperatures of the system electronics 304 as temperature differentials may be detected by current sensing thermistor circuits 306 for power provided to system electronics 304.

In a particular embodiment, information handling system 300 may allow for multiple current-sensing thermistor circuits 306 to provide separate inputs to system cooling fan controller 310 for controlling a specific fan motor for and may cool associated electronic components or devices within system electronics 304. For example, a first current sensing thermistor circuit 306 can be coupled to a power trace for providing power to a processor within information handling system 300. Other current sensing thermistor circuits may also be coupled to a second power trace used to power a storage device such as hard disk drive (not expressly shown). Separate thermistor outputs 308 may be provided to the system cooling fan controller 310 and may alter fan speeds of first fan 318 and the $n^{th}$ fan 320 as needed. In another embodiment, the thermistor outputs 308 may be provided in association with an additional input source to existing fan control algorithms used to control fan speeds of the first fan s 318 and $n^{th}$ fan 320 and can be used to insure component cooling requirements are met. For example, accurate inputs can be provided by thermistor outputs 308 and may be used by existing algorithms to control fan speeds for the first fan 318 and $n^{th}$ fan 320. In some instances, fans speeds that target specific components within the system electronics 304 may be provided thereby reducing undesirable and inaccurate fan speed operation that may lead to increased in power consumption that may be attributed to operating the first fan 318 and $n^{th}$ fan 320.

In another embodiment, the information handling system 300 may also include various other temperature monitoring input devices, such as remote devices or thermistors (not expressly shown) that may be operable to monitor ambient temperatures of the information handling system 300 or localized component specific power consumption for specific devices within the system electronics 304. For example, current sensing thermistor circuits 306 may be used alone or in combination with other temperature detection and control systems and may provide inputs 308, in addition to, or in place of additional temperature detection and control systems. In one embodiment, current sensing thermistor circuits 306 may provide an input to a temperature mapping application, logic, or software that receives inputs from various input sources and may be used to control system cooling fan controller 310 for maintaining a desired temperature. In this manner, operators of information handling system 100 that may be sensitive to system power consumption and system operation acoustics that may be caused by large amounts of fan noise may benefit from additional control of the first fan 318 and the n$^{th}$ fan 320 that can be controlled by specific power consumption of system electronics 304.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system including a system fan control for maintaining operating temperatures of electronics within the information handling system, the information handling system comprising:
   a first power trace provided in association with a power circuit for powering electronics within the information handling system, the first power trace including a first reduced trace width region along the first power trace and operable to provide a temperature differential in response to a current change within the first reduced trace width region;
   a first thermistor provided in close proximity to the first reduced trace width region and operable to detect the temperature differential provided in response to the current change; and
   a fan controller coupled to an output of the first thermistor and responsive to the temperature differential detected by the first thermistor, the fan controller operable to alter a fan speed of a first fan based on the output to maintain an operating temperature of the electronics coupled to the first power trace.

2. The system of claim 1, further comprising:
   a second thermistor proximally located to a second reduced trace width region along a second power trace and operable to detect a second temperature differential; and
   wherein the second thermistor is operable to provide a second input to the fan controller to alter the first fan speed.

3. The system of claim 2, wherein the fan controller is operable to detect the second input and alter an operating speed of a second fan to maintain an operating temperature of electronics coupled to the second power trace.

4. The system of claim 1, further comprising a remote thermistor coupled at a location remote to the first thermistor, the remote thermistor operable to provide an input to the fan controller to alter the fan speed of the first fan based on an ambient temperature.

5. The system of claim 4, wherein the fan controller is operable to receive an input from the first thermistor and an input from the remote thermistor and alter the fan speed of the first fan in response to at least one of the inputs.

6. The system of claim 1, wherein the first thermistor is thermally coupled to the first reduced contact region using a thermal via.

7. The system of claim 1, wherein the first thermistor is coupled to a rear portion of a printed circuit board having the first reduced trace width region.

8. The system of claim 1, further comprising:
   sensing means for detecting power consumed by the electronics;
   controller means for altering the fan speed to maintain an operating temperature of the electronics; and
   input means for receiving signals from the thermistor.

9. A method of maintaining operating temperatures of electronics stored within an information handling system, the method comprising the steps of:
   detecting a first temperature differential using a first thermistor provided in close proximity to a first power trace operably associated with a power circuit for powering electronics within the information handling system, the first power trace including a first reduced trace width region along the first power trace and operable to provide the first temperature differential in response to a current change within the first reduced trace width region;
   receiving an input from the first thermistor; and
   altering a fan speed of a first fan to maintain an operating temperature of the electronics in response to the input.

10. The method of claim 9, further comprising:
    detecting a second temperature differential using a second thermistor proximally located to a second power trace having a second reduced trace width region along the second power trace; and
    altering the fan speed of the first fan in response to a second temperature differential to maintain an operating temperature of electronics coupled to the second power trace.

11. The method of claim 9, further comprising:
    detecting a second temperature differential using a second thermistor proximally located to a second power trace having a second reduced trace width region; and
    altering the fan speed of the first fan in response to a second temperature differential to maintain an operating temperature of electronics coupled to the second power trace.

12. The method of claim 11, further comprising:
    receiving a second input at a fan controller from a source other than the first thermistor; and
    altering the fan speed of the first fan in response to the second input.

13. The method of claim 9, further comprising:
    determining a trace width sufficient to provide a temperature differential as an input to a controller to maintain the operating temperature through altering the fan speed of the first fan; and
    providing the trace width at the reduced trace width region of the first power trace.

14. The method of claim 13, further comprising:
    determining a resistive heating to be provided by the reduced trace width region;
    determining a thermistor type operable to detect the resistive heating as the first temperature differential and provide the input; and
    coupling the thermistor type as the first thermistor proximal to the first reduced trace width region.

15. A printed circuit board for use within an information handling system including a system fan control for maintaining operating temperatures of electronics stored within the information handling system, the printed circuit board comprising:
    a power trace provided in association with a power circuit for powering electronics within the information handling system, the power trace including a width and a reduced trace width region along the power trace and operable to provide a temperature differential in response to a current change within the reduced trace width region;

a thermistor coupling region operable to mount a thermistor in close proximity to the reduced trace width region, the thermistor operable to detect the temperature differential provided in response to the current change; and a thermistor output connection provided in association with the thermistor coupling region, the thermistor output region operable to be coupled to a fan controller of the information handling system to provide an input to alter a fan speed to maintain an operating temperature of the electronics coupled to the power trace.

16. The printed circuit board of claim 15, wherein the reduced trace width region is reduced by at least twenty-five percent (25%) of the width.

17. The printed circuit board of claim 15, wherein the reduced trace width region is reduced by at least fifty percent (50%) of the width.

18. The printed circuit board of claim 15, further comprising providing the reduce trace width region at a distance from a ground plane of the power circuitry.

19. The printed circuit board of claim 15, further comprising providing the reduce trace width region at a distance from a power plane of the power circuitry.

20. The printed circuit board of claim 15, further comprising a thermistor mounted to the thermistor coupling region and operable to detect resistive heating of the reduced trace width region.

* * * * *